(12) United States Patent
Khlat

(10) Patent No.: US 12,231,098 B2
(45) Date of Patent: Feb. 18, 2025

(54) MULTI-MODE POWER MANAGEMENT APPARATUS

(71) Applicant: Qorvo US, Inc., Greensboro, NC (US)

(72) Inventor: Nadim Khlat, Cugnaux (FR)

(73) Assignee: Qorvo US, Inc., Greensboro, NC (US)

( * ) Notice: Subject to any disclaimer, the term of this patent is extended or adjusted under 35 U.S.C. 154(b) by 486 days.

(21) Appl. No.: 17/629,759

(22) PCT Filed: Jul. 22, 2020

(86) PCT No.: PCT/US2020/043067
§ 371 (c)(1),
(2) Date: Jan. 24, 2022

(87) PCT Pub. No.: WO2021/016350
PCT Pub. Date: Jan. 28, 2021

(65) Prior Publication Data
US 2022/0255513 A1   Aug. 11, 2022

Related U.S. Application Data

(60) Provisional application No. 62/878,358, filed on Jul. 25, 2019.

(51) Int. Cl.
H03F 3/195     (2006.01)
H03F 1/02      (2006.01)
(Continued)

(52) U.S. Cl.
CPC ........... *H03F 3/195* (2013.01); *H03F 1/0227* (2013.01); *H03F 3/245* (2013.01); *H03F 3/72* (2013.01);
(Continued)

(58) Field of Classification Search
CPC ........ H03F 3/195; H03F 1/0227; H03F 3/245; H03F 3/72; H03F 2200/102; H03F 2200/451; H03F 1/0222; H03F 3/19
(Continued)

(56) References Cited

U.S. PATENT DOCUMENTS 6,529,716 B1   3/2003   Eidson et al.
6,788,151 B2   9/2004   Shvarts et al.
(Continued)

FOREIGN PATENT DOCUMENTS

EP   3644500 A1      4/2020
WO   2018182778 A1   10/2018

OTHER PUBLICATIONS

Non-Final Office Action for U.S. Appl. No. 16/263,368, mailed Dec. 26, 2019, 6 pages.
(Continued)

*Primary Examiner* — Hieu P Nguyen
(74) *Attorney, Agent, or Firm* — Withrow & Terranova, P.L.L.C.

(57) ABSTRACT

A multi-mode power management apparatus is provided. In embodiments disclosed herein, the multi-mode power management apparatus can be configured to operate in different power management modes across a wide range of modulation bandwidth (e.g., 80 KHz to over 200 MHz). The multi-mode power management apparatus includes a power management integrated circuit (PMIC) and an envelope tracking integrated (ET) circuit (ETIC), which are implemented in separate dies. The PMIC is configured to generate a low-frequency current and a low-frequency voltage. The ETIC is configured to generate a pair of ET voltages. Depending on the power management mode, the multi-mode power management apparatus can selectively output one or more of the ET voltages and the low-frequency voltage to
(Continued)

Figure 1:
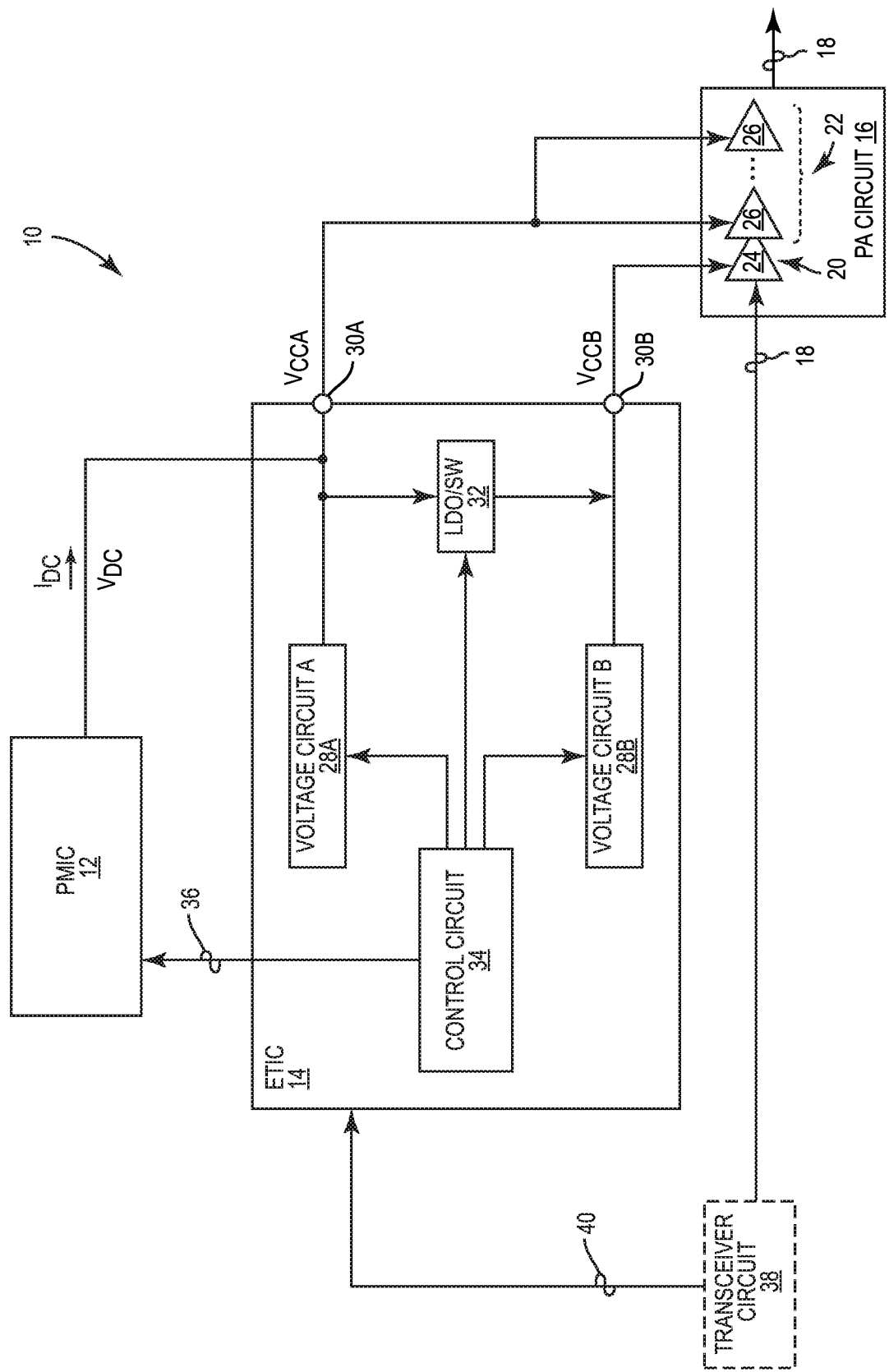

different stages (e.g., driver stage and output stage) of a power amplifier circuit, thus helping to maintain optimal efficiency and linearity of the power amplifier circuit across the wide range of modulation bandwidth.

20 Claims, 2 Drawing Sheets

(51) Int. Cl.
  *H03F 3/24* (2006.01)
  *H03F 3/72* (2006.01)
(52) U.S. Cl.
  CPC .. *H03F 2200/102* (2013.01); *H03F 2200/451* (2013.01)
(58) Field of Classification Search
  USPC .......................................... 330/310, 297, 136
  See application file for complete search history.

(56) References Cited

U.S. PATENT DOCUMENTS

| | | |
|---|---|---|
| 7,859,338 B2 | 12/2010 | Bajdechi et al. |
| 8,019,289 B2 | 9/2011 | Gorbachov |
| 8,290,453 B2 | 10/2012 | Yoshihara |
| 8,385,859 B2 | 2/2013 | Hamano |
| 8,476,976 B2 | 7/2013 | Wimpenny |
| 8,598,950 B2 | 12/2013 | Khesbak |
| 8,600,321 B2 | 12/2013 | Nambu et al. |
| 8,611,402 B2 | 12/2013 | Chiron |
| 8,665,016 B2 | 3/2014 | Chowdhury et al. |
| 8,665,931 B2 | 3/2014 | Afsahi et al. |
| 8,803,603 B2 | 8/2014 | Wimpenny |
| 8,816,272 B1 | 8/2014 | Brown et al. |
| 8,816,768 B2 | 8/2014 | Tseng et al. |
| 8,818,305 B1 | 8/2014 | Schwent et al. |
| 8,921,774 B1 | 12/2014 | Brown et al. |
| 8,942,651 B2 | 1/2015 | Jones |
| 8,989,682 B2 | 3/2015 | Ripley et al. |
| 9,002,303 B2 | 4/2015 | Brobston |
| 9,065,509 B1 | 6/2015 | Yan et al. |
| 9,197,162 B2 | 11/2015 | Chiron et al. |
| 9,197,256 B2 | 11/2015 | Khlat |
| 9,246,460 B2 | 1/2016 | Khlat et al. |
| 9,247,496 B2 | 1/2016 | Khlat |
| 9,270,230 B2 | 2/2016 | Henshaw et al. |
| 9,277,501 B2 | 3/2016 | Lorenz et al. |
| 9,287,829 B2 | 3/2016 | Nobbe et al. |
| 9,288,098 B2 | 3/2016 | Yan et al. |
| 9,294,043 B2 | 3/2016 | Ripley et al. |
| 9,356,760 B2 | 5/2016 | Larsson et al. |
| 9,374,005 B2 | 6/2016 | Rozek et al. |
| 9,379,667 B2 | 6/2016 | Khlat et al. |
| 9,438,172 B2 | 9/2016 | Cohen |
| 9,515,621 B2 | 12/2016 | Hietala et al. |
| 9,515,622 B2 | 12/2016 | Nentwig et al. |
| 9,516,693 B2 | 12/2016 | Khlat et al. |
| 9,560,595 B2 | 1/2017 | Dakshinamurthy et al. |
| 9,571,152 B2 | 2/2017 | Ripley et al. |
| 9,596,110 B2 | 3/2017 | Jiang et al. |
| 9,614,476 B2 | 4/2017 | Khlat |
| 9,614,477 B1 | 4/2017 | Rozenblit et al. |
| 9,641,206 B2 | 5/2017 | Pratt et al. |
| 9,671,801 B2 | 6/2017 | Bhattad et al. |
| 9,743,357 B2 | 8/2017 | Tabe |
| 9,831,834 B2 | 11/2017 | Balteanu et al. |
| 9,831,934 B2 | 11/2017 | Kotecha et al. |
| 9,843,294 B2 | 12/2017 | Khlat |
| 9,859,845 B2 | 1/2018 | Sarbishaei et al. |
| 9,912,296 B1 | 3/2018 | Cheng et al. |
| 9,912,297 B2 | 3/2018 | Khlat |
| 9,912,301 B2 | 3/2018 | Xue et al. |
| 9,941,844 B2 | 4/2018 | Khlat |
| 9,948,240 B2 | 4/2018 | Khlat et al. |
| 9,954,436 B2 | 4/2018 | Khlat |
| 9,960,737 B1 | 5/2018 | Kovac |
| 9,974,050 B2 | 5/2018 | Wiser et al. |
| 9,991,851 B1 | 6/2018 | Dinur et al. |
| 9,991,856 B2 | 6/2018 | Khesbak et al. |
| 9,991,913 B1 | 6/2018 | Dinur et al. |
| 10,003,303 B2 | 6/2018 | Afsahi et al. |
| 10,069,470 B2 | 9/2018 | Khlat et al. |
| 10,090,809 B1 | 10/2018 | Khlat |
| 10,097,145 B1 * | 10/2018 | Khlat .................... H03F 1/0211 |
| 10,097,387 B2 | 10/2018 | Wiser et al. |
| 10,103,926 B1 | 10/2018 | Khlat |
| 10,110,169 B2 | 10/2018 | Khesbak et al. |
| 10,141,891 B2 | 11/2018 | Gomez et al. |
| 10,158,328 B2 | 12/2018 | Nobbe et al. |
| 10,158,330 B1 | 12/2018 | Khlat |
| 10,171,037 B2 | 1/2019 | Khlat |
| 10,171,038 B1 | 1/2019 | Chen et al. |
| 10,181,826 B2 | 1/2019 | Khlat et al. |
| 10,204,775 B2 | 2/2019 | Brown et al. |
| 10,305,429 B2 | 5/2019 | Choo et al. |
| 10,326,408 B2 | 6/2019 | Khlat et al. |
| 10,355,646 B2 | 7/2019 | Lee et al. |
| 10,361,660 B2 | 7/2019 | Khlat |
| 10,382,147 B2 | 8/2019 | Ripley et al. |
| 10,396,716 B2 | 8/2019 | Afsahi et al. |
| 10,419,255 B2 | 9/2019 | Wiser et al. |
| 10,432,145 B2 | 10/2019 | Khlat |
| 10,439,557 B2 | 10/2019 | Khlat et al. |
| 10,439,789 B2 | 10/2019 | Brunel et al. |
| 10,454,428 B2 | 10/2019 | Khesbak et al. |
| 10,476,437 B2 | 11/2019 | Nag et al. |
| 11,088,660 B2 | 8/2021 | Lin et al. |
| 11,152,976 B2 | 10/2021 | Cho et al. |
| 11,387,789 B2 | 7/2022 | Khlat et al. |
| 11,424,719 B2 | 8/2022 | Khlat et al. |
| 11,569,783 B2 | 1/2023 | Nomiyama et al. |
| 2004/0100323 A1 | 5/2004 | Khanifer et al. |
| 2009/0128236 A1 | 5/2009 | Wilson |
| 2009/0253389 A1 | 10/2009 | Ma et al. |
| 2011/0223875 A1 | 9/2011 | Hamano |
| 2012/0142304 A1 | 6/2012 | Degani et al. |
| 2012/0146731 A1 | 6/2012 | Khesbak |
| 2012/0194274 A1 | 8/2012 | Fowers et al. |
| 2012/0302179 A1 | 11/2012 | Brobston |
| 2012/0309333 A1 | 12/2012 | Nambu et al. |
| 2013/0141159 A1 | 6/2013 | Strange et al. |
| 2013/0207731 A1 | 8/2013 | Balteanu |
| 2013/0285750 A1 | 10/2013 | Chowdhury et al. |
| 2014/0057684 A1 | 2/2014 | Khlat |
| 2014/0111279 A1 | 4/2014 | Brobston |
| 2014/0218109 A1 | 8/2014 | Wimpenny |
| 2014/0273897 A1 | 9/2014 | Drogi et al. |
| 2014/0306763 A1 | 10/2014 | Hong et al. |
| 2014/0306769 A1 | 10/2014 | Khlat et al. |
| 2014/0315504 A1 | 10/2014 | Sakai et al. |
| 2014/0354251 A1 | 12/2014 | Williams |
| 2014/0361837 A1 | 12/2014 | Strange et al. |
| 2015/0009980 A1 | 1/2015 | Modi et al. |
| 2015/0091645 A1 | 4/2015 | Park et al. |
| 2015/0123628 A1 | 5/2015 | Bhattad et al. |
| 2015/0194988 A1 | 7/2015 | Yan et al. |
| 2015/0236729 A1 | 8/2015 | Peng et al. |
| 2016/0036389 A1 | 2/2016 | Balteanu et al. |
| 2016/0050629 A1 | 2/2016 | Khesbak et al. |
| 2016/0094185 A1 | 3/2016 | Shute |
| 2016/0094186 A1 | 3/2016 | Cohen |
| 2016/0099686 A1 | 4/2016 | Perreault et al. |
| 2016/0105151 A1 | 4/2016 | Langer |
| 2016/0181995 A1 | 6/2016 | Nentwig et al. |
| 2016/0204809 A1 | 7/2016 | Pratt et al. |
| 2016/0226448 A1 | 8/2016 | Wimpenny |
| 2016/0294587 A1 | 10/2016 | Jiang et al. |
| 2017/0070199 A1 | 3/2017 | Anderson et al. |
| 2017/0077877 A1 | 3/2017 | Anderson |
| 2017/0093340 A1 | 3/2017 | Khesbak |
| 2017/0207802 A1 | 7/2017 | Pratt et al. |
| 2017/0230924 A1 | 8/2017 | Wolberg et al. |
| 2017/0279412 A1 | 9/2017 | Afsahi et al. |

(56) References Cited

U.S. PATENT DOCUMENTS

| | | |
|---|---|---|
| 2017/0331433 A1 | 11/2017 | Khlat |
| 2017/0353287 A1 | 12/2017 | Onaka et al. |
| 2018/0048276 A1 | 2/2018 | Khlat et al. |
| 2018/0138862 A1 | 5/2018 | Balteanu et al. |
| 2018/0138863 A1 | 5/2018 | Khlat |
| 2018/0159476 A1 | 6/2018 | Balteanu et al. |
| 2018/0159566 A1 | 6/2018 | Dinur et al. |
| 2018/0287564 A1 | 10/2018 | Afsahi et al. |
| 2018/0309409 A1 | 10/2018 | Khlat |
| 2018/0309414 A1 | 10/2018 | Khlat et al. |
| 2018/0316440 A1 | 11/2018 | Mita |
| 2018/0358930 A1 | 12/2018 | Haine |
| 2019/0036493 A1 | 1/2019 | Khlat et al. |
| 2019/0044480 A1 | 2/2019 | Khlat |
| 2019/0089310 A1 | 3/2019 | Khlat et al. |
| 2019/0109566 A1 | 4/2019 | Folkmann et al. |
| 2019/0109613 A1 | 4/2019 | Khlat et al. |
| 2019/0181804 A1 | 6/2019 | Khlat |
| 2019/0222176 A1 | 7/2019 | Khlat |
| 2019/0222178 A1 | 7/2019 | Khlat et al. |
| 2019/0222181 A1 | 7/2019 | Khlat |
| 2019/0267947 A1 | 8/2019 | Khlat et al. |
| 2019/0356285 A1 | 11/2019 | Khlat et al. |
| 2020/0036337 A1 | 1/2020 | Khlat |
| 2020/0076375 A1 | 3/2020 | Khlat |
| 2020/0076376 A1 | 3/2020 | Khlat |
| 2020/0127607 A1 | 4/2020 | Khlat |
| 2020/0127608 A1 | 4/2020 | Khlat |
| 2020/0127609 A1 | 4/2020 | Khlat |
| 2020/0127611 A1 | 4/2020 | Khlat |
| 2020/0127612 A1 | 4/2020 | Khlat et al. |
| 2020/0127625 A1 | 4/2020 | Khlat |
| 2020/0127730 A1 | 4/2020 | Khlat |
| 2020/0136575 A1 | 4/2020 | Khlat et al. |
| 2020/0228063 A1 | 7/2020 | Khlat |
| 2020/0266766 A1 | 8/2020 | Khlat et al. |
| 2020/0295708 A1 | 9/2020 | Khlat |
| 2020/0295710 A1 | 9/2020 | Khlat |
| 2020/0295713 A1 | 9/2020 | Khlat |
| 2020/0343859 A1 | 10/2020 | Khlat |
| 2020/0350878 A1 | 11/2020 | Drogi et al. |
| 2020/0382061 A1 | 12/2020 | Khlat |
| 2020/0382062 A1 | 12/2020 | Khlat |
| 2020/0382074 A1 | 12/2020 | Khlat |
| 2021/0006206 A1 | 1/2021 | Khlat |
| 2021/0194517 A1 | 6/2021 | Mirea et al. |
| 2021/0384869 A1 | 12/2021 | Khlat |
| 2024/0014782 A1 | 1/2024 | Khlat |

OTHER PUBLICATIONS

Notice of Allowance for U.S. Appl. No. 16/273,288, mailed Dec. 13, 2019, 8 pages.

Non-Final Office Action for U.S. Appl. No. 16/263,316, mailed Dec. 23, 2019, 9 pages.

Notice of Allowance for U.S. Appl. No. 16/193,513, mailed Mar. 25, 2020, 8 pages.

Non-Final Office Action for U.S. Appl. No. 16/250,229, mailed Apr. 29, 2020, 7 pages.

Non-Final Office Action for U.S. Appl. No. 16/267,740, mailed Apr. 30, 2020, 10 pages.

Final Office Action for U.S. Appl. No. 16/263,316, mailed May 13, 2020, 10 pages.

Non-Final Office Action for U.S. Appl. No. 16/278,886, mailed Apr. 29, 2020, 9 pages.

Quayle Action for U.S. Appl. No. 16/267,779, mailed May 1, 2020, 8 pages.

Final Office Action for U.S. Appl. No. 16/263,368, mailed May 22, 2020, 9 pages.

Notice of Allowance for U.S. Appl. No. 16/250,229, mailed Sep. 22, 2020, 7 pages.

Quayle Action for U.S. Appl. No. 16/267,740, mailed Oct. 19, 2020, 7 pages.

Notice of Allowance for U.S. Appl. No. 16/267,740, mailed Mar. 3, 2021, 8 pages.

Non-Final Office Action for U.S. Appl. No. 16/263,316, mailed Jul. 17, 2020, 4 pages.

Non-Final Office Action for U.S. Appl. No. 16/263,316, mailed Nov. 24, 2020, 4 pages.

Notice of Allowance for U.S. Appl. No. 16/263,316, mailed Mar. 30, 2021, 7 pages.

Notice of Allowance for U.S. Appl. No. 16/270,119, mailed Jun. 18, 2020, 9 pages.

Non-Final Office Action for U.S. Appl. No. 17/027,963, mailed Aug. 13, 2021, 6 pages.

Notice of Allowance for U.S. Appl. No. 16/278,886, mailed Sep. 22, 2020, 8 pages.

Non-Final Office Action for U.S. Appl. No. 16/250,298, mailed Aug. 20, 2020, 8 pages.

Quayle Action for U.S. Appl. No. 16/250,298, mailed Feb. 3, 2021, 5 pages.

Notice of Allowance for U.S. Appl. No. 16/250,298, mailed Apr. 15, 2021, 8 pages.

Non-Final Office Action for U.S. Appl. No. 16/689,236, mailed Mar. 2, 2021, 15 pages.

Notice of Allowance for U.S. Appl. No. 16/689,236, mailed Jun. 9, 2021, 7 pages.

Non-Final Office Action for U.S. Appl. No. 16/263,368, mailed Aug. 7, 2020, 4 pages.

Non-Final Office Action for U.S. Appl. No. 16/263,368, mailed Dec. 17, 2020, 8 pages.

Notice of Allowance for U.S. Appl. No. 16/263,368, mailed Apr. 29, 2021, 7 pages.

Notice of Allowance for U.S. Appl. No. 16/508,704, mailed Dec. 30, 2020, 7 pages.

Notice of Allowance for U.S. Appl. No. 16/508,768, mailed Oct. 27, 2020, 9 pages.

Quayle Action for U.S. Appl. No. 16/514,339, mailed Nov. 19, 2020, 9 pages.

Non-Final Office Action for U.S. Appl. No. 16/660,900, mailed Feb. 18, 2021, 7 pages.

Notice of Allowance for U.S. Appl. No. 16/689,417, mailed Feb. 24, 2021, 7 pages.

Non-Final Office Action for U.S. Appl. No. 16/669,728, mailed Jun. 3, 2021, 9 pages.

Final Office Action for U.S. Appl. No. 17/027,963, mailed Jan. 14, 2022, 4 pages.

Notice of Allowance for U.S. Appl. No. 17/027,963, mailed Mar. 30, 2022, 8 pages.

Notice of Allowance and Examiner-Initiated Interview Summary for U.S. Appl. No. 16/669,728, mailed Dec. 8, 2021, 8 pages.

International Search Report and Written Opinion for International Patent Application No. PCT/US2020/043067, mailed Nov. 11, 2020, 19 pages.

International Search Report and Written Opinion for International Patent Application No. PCT/US2021/052151, mailed Jan. 4, 2022, 16 pages.

International Preliminary Report on Patentability for International Patent Application No. PCT/US2021/052151, mailed Oct. 13, 2022, 21 pages.

Notice of Allowance for U.S. Appl. No. 17/408,651, mailed Jun. 23, 2023, 8 pages.

Final Office Action for U.S. Appl. No. 17/942,472, mailed Jul. 19, 2023, 16 pages.

Advisory Action for U.S. Appl. No. 17/942,472, mailed Sep. 15, 2023, 3 pages.

Notice of Allowance for U.S. Appl. No. 17/942,472, mailed Oct. 18, 2023, 10 pages.

Corrected Notice of Allowability and Response to Rule 312 Communication for U.S. Appl. No. 17/942,472, mailed Nov. 17, 2023, 6 pages.

Non-Final Office Action for U.S. Appl. No. 17/408,651, mailed Mar. 2, 2023, 13 pages.

Non-Final Office Action for U.S. Appl. No. 17/942,472, mailed Feb. 16, 2023, 13 pages.

(56) References Cited

OTHER PUBLICATIONS

Extended European Search Report for European Patent Application No. 22195683.2, mailed Feb. 10, 2023, 12 pages.
Quayle Action for U.S. Appl. No. 17/404,587, mailed Jan. 31, 2024, 8 pages.
Extended European Search Report for European Patent Application No. 22152966.2, mailed Jun. 23, 2022, 9 pages.
Examination Report for European Patent Application No. 20754095.6, mailed Sep. 13, 2024, 7 pages.
Examination Report for European Patent Application No. 22152966.2, mailed Sep. 17, 2024, 4 pages.

* cited by examiner

MULTI-MODE POWER MANAGEMENT APPARATUS

RELATED APPLICATIONS

This application is a 35 USC 371 national phase filing of International Application No. PCT/US2020/043067, filed Jul. 22, 2020, the disclosure of which is incorporated herein by reference in its entirety.

FIELD OF THE DISCLOSURE

The technology of the disclosure relates generally to a power management apparatus.

BACKGROUND

Mobile communication devices, such as smartphones, have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience has also led to the rise of so-called wearable devices, such as smartwatches. Over time, these wearable devices have evolved from simple companion devices to mobile communication devices into full-fledged multi-functional wireless communication devices. Nowadays, most wearable electronic devices are often equipped with digital and analog circuitries capable of communicating a radio frequency (RF) signal(s) in a variety of wireless communication systems, such as long-term evolution (LTE), Wi-Fi, Bluetooth, and so on. Like mobile communication devices, wearable devices often employ sophisticated power amplifiers to amplify RF signal(s) to help improve coverage range, data throughput, and reliability of the wearable devices.

Envelope tracking (ET) is a power management technology designed to improve efficiency levels of power amplifiers. In this regard, it may be desirable to employ ET across a variety of wireless communication technologies to help reduce power consumption and thermal dissipation in wearable devices. Notably, the RF signal(s) communicated in different wireless communication systems may correspond to different modulation bandwidths (e.g., from 80 KHz to over 200 MHz). As such, it may be further desirable to ensure that the power amplifiers can maintain optimal efficiency and linearity across a wide range of modulation bandwidth.

SUMMARY

Embodiments of the disclosure relate to a multi-mode power management apparatus. In embodiments disclosed herein, the multi-mode power management apparatus can be configured to operate in different power management modes across a wide range of modulation bandwidth (e.g., 80 KHz to over 200 MHz). The multi-mode power management apparatus includes a power management integrated circuit (PMIC) and an envelope tracking integrated (ET) circuit (ETIC), which are implemented in separate dies. The PMIC is configured to generate a low-frequency current and a low-frequency voltage. The ETIC is configured to generate a pair of ET voltages. Depending on the power management mode, the multi-mode power management apparatus can selectively output one or more of the ET voltages and the low-frequency voltage to different stages (e.g., driver stage and output stage) of a power amplifier circuit, thus helping to maintain optimal efficiency and linearity of the power amplifier circuit across the wide range of modulation bandwidth.

In one aspect, a multi-mode power management apparatus is provided. The multi-mode power management apparatus includes a PMIC configured to generate a low-frequency current and a low-frequency voltage. The multi-mode power management apparatus also includes an ETIC. The ETIC includes a first node coupled to the PMIC. The ETIC also includes a second node coupled to the first node via a multifunction circuit. The ETIC also includes a first voltage circuit configured to generate a first ET voltage based on a first ET target voltage. The ETIC also includes a second voltage circuit configured to generate a second ET voltage based on a second ET target voltage. The ETIC also includes a control circuit. The control circuit is configured to cause the first node and the second node to output one or more of the first ET voltage, the second ET voltage, and the low-frequency voltage. The control circuit is also configured to cause the first node and the second node to output at least the low-frequency current.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

Figure 2:
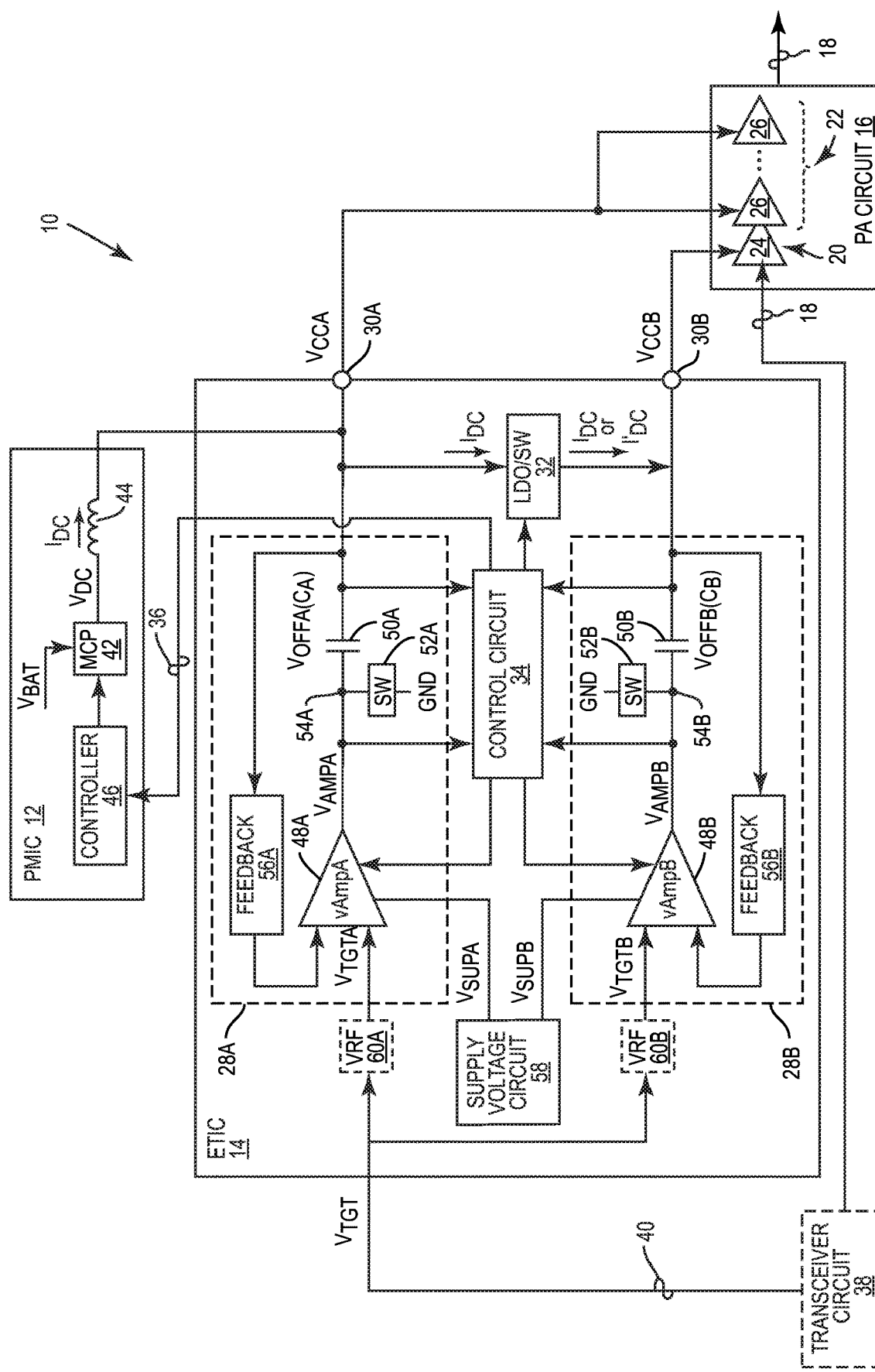

FIG. 1 is a schematic diagram of an exemplary multi-mode power management apparatus according to an embodiment of the present disclosure; and FIG. 2 is a schematic diagram illustrating a detailed configuration of the multi-mode power management apparatus of FIG. 1 in different power management modes.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to a multi-mode power management apparatus. In embodiments disclosed herein, the multi-mode power management apparatus can be configured to operate in different power management modes across a wide range of modulation bandwidth (e.g., 80 KHz to over 200 MHz). The multi-mode power management apparatus includes a power management integrated circuit (PMIC) and an envelope tracking integrated (ET) circuit (ETIC), which are implemented in separate dies. The PMIC is configured to generate a low-frequency current and a low-frequency voltage. The ETIC is configured to generate a pair of ET voltages. Depending on the power management mode, the multi-mode power management apparatus can selectively output one or more of the ET voltages and the low-frequency voltage to different stages (e.g., driver stage and output stage) of a power amplifier circuit, thus helping to maintain optimal efficiency and linearity of the power amplifier circuit across the wide range of modulation bandwidth.

FIG. 1 is a schematic diagram of an exemplary multi-mode power management apparatus 10 configured according to an embodiment of the present disclosure. The multi-mode power management apparatus 10 includes a PMIC 12 and an ETIC 14 that are provided in separate dies. The multi-mode power management apparatus 10 may include or be coupled to a multi-stage power amplifier circuit 16 configured to amplify a radio frequency (RF) signal 18. The multi-stage power amplifier circuit 16 may include a driver stage 20 and an output stage 22. In a non-limiting example, the driver stage 20 includes a power amplifier 24 and the output stage 22 includes one or more power amplifiers 26.

In examples discussed herein, the multi-mode power management apparatus 10 can be configured to operate in different power management modes, depending on modulation bandwidth of the RF signal 18. In a non-limiting example, the multi-mode power management apparatus 10 operates in a first power management mode when the modulation bandwidth is greater than 160 MHz (>160 MHz), a second power management mode when the modulation bandwidth is between 1 MHz and 160 MHz (>1 MHz and ≤160 MHz), a third power management mode when the modulation bandwidth is between 120 KHz and 1 MHz (>120 KHz and ≤1 MHz), a fourth power management mode when the modulation bandwidth is between 80 KHz and 120 KHz (>80 KHz and ≤120 KHz), or a fifth power management mode when the modulation bandwidth is below 80 KHz (≤80 KHz). Thus, by operating in different power management modes based on the modulation bandwidth of the RF signal 18, the multi-mode power management apparatus 10 can maintain optimal efficiency and linearity of the multi-stage power amplifier circuit 16 across a wide range of modulation bandwidth.

The PMIC 12 is configured to generate a low-frequency voltage $V_{DC}$ (e.g., a constant voltage or a modulated constant voltage) and a low-frequency current $I_{DC}$ (e.g., a direct current or a modulated direct current). The ETIC 14 includes a first voltage circuit 28A configured to generate a first ET voltage $V_{CCA}$ and a second voltage circuit 28B configured to generate a second ET voltage $V_{CCB}$. The ETIC 14 includes a first node 30A and a second node 30B, which may be coupled to the output stage 22 and the driver stage 20 of the multi-stage power amplifier circuit 16, respectively. The first node 30A is coupled to the first voltage circuit 28A and the PMIC 12. The second node 30B is coupled to the second voltage circuit 28B and to the first node 30A via a multifunction circuit 32 (denoted as "LDO/SW"). In a non-limiting example, the multifunction circuit 32 may include a low dropout (LDO) and a switch (not shown).

The ETIC 14 includes a control circuit 34, which can be any type of microcontroller, or a field-programmable gate array (FPGA), as an example. It should be appreciated that functionality of the control circuit 34 may be shared between multiple control circuits and/or controllers without affecting functionality and operation of the multi-mode power management apparatus 10.

The control circuit 34 is coupled to the first voltage circuit 28A, the second voltage circuit 28B, and the multifunction circuit 32. As discussed in detail below, the control circuit 34 can individually or collectively control the first voltage circuit 28A, the second voltage circuit 28B, and the multifunction circuit 32 to cause the first node 30A and the second node 30B to output one or more of the low-frequency voltage $V_{DC}$, the first ET voltage $V_{CCA}$, and the second ET voltage $V_{CCB}$ in the different power management modes. In addition, the control circuit 34 can also individually or collectively control the first voltage circuit 28A, the second voltage circuit 28B, and the multifunction circuit 32 to cause the first node 30A and the second node 30B to output at least the low-frequency current $I_{DC}$ in the different power management modes.

The control circuit 34 may provide a feedback signal 36 to the PMIC 12. The feedback signal 36 enables the PMIC 12 to adjust the low-frequency current $I_{DC}$ and/or the low-frequency voltage $V_{DC}$ accordingly. The control circuit 34 may be coupled to a transceiver circuit 38 that generates the RF signal 18. In this regard, the control circuit 34 may be able to determine the modulation bandwidth of the RF signal 18 and, thus, the different power management modes based on an indication 40 from the transceiver circuit 38.

FIG. 2 is a schematic diagram illustrating a detailed configuration of the multi-mode power management apparatus 10 of FIG. 1 in the different power management modes. Common elements between FIGS. 1 and 2 are shown therein with common element numbers and will not be re-described herein.

In a non-limiting example, the PMIC 12 includes a multi-level charge pump (MCP) 42 configured to generate the low-frequency voltage $V_{DC}$ at multiple levels based on a battery voltage $V_{BAT}$ (e.g., $0 \times V_{BAT}$, $1 \times V_{BAT}$, or $2 \times V_{BAT}$). The PMIC 12 also includes a power inductor 44 configured to induce the low-frequency current $I_{DC}$ based on the low-frequency voltage $V_{DC}$. The PMIC 12 further includes a controller 46, which can be any type of microcontroller or microprocessor, as an example. The controller 46 receives the feedback signal 36 from the control circuit 34 in the ETIC 14. Accordingly, the controller 46 can control the MCP 42 to adjust the low-frequency voltage $V_{DC}$ and, thus, adjust the low-frequency current $I_{DC}$ accordingly.

The first voltage circuit 28A includes a first voltage amplifier 48A (denoted as "vAmpA") configured to generate a first initial ET voltage $V_{AMPA}$ based on a first ET target voltage $V_{TGTA}$ and a first supply voltage $V_{SUPA}$. In this regard, the first initial ET voltage $V_{AMPA}$ can correspond to a time-variant voltage envelope that tracks (e.g., rises and falls) a time-variant target envelope of the first ET target voltage $V_{TGTA}$. The first supply voltage $V_{SUPA}$ may be adjusted to cause the first voltage amplifier 48A to adjust amplitude of the first initial ET voltage $V_{AMPA}$ and thus adjust amplitude of the first ET voltage $V_{CCA}$.

The first voltage circuit 28A also includes a first offset capacitor 50A having a first capacitance $C_A$ (e.g., 4.7 µF) coupled between the first voltage amplifier 48A and the first node 30A. The first offset capacitor 50A is configured to raise the first initial ET voltage $V_{AMPA}$ by a first offset voltage $V_{OFFA}$ (e.g., 0.8 V) to generate the first ET voltage $V_{CCA}$ ($V_{CCA}=V_{AMPA}+V_{OFFA}$).

The first voltage circuit 28A also includes a first switch 52A (denoted as "SW") coupled between a first coupling node 54A and a ground (GND). The first voltage circuit 28A further includes a first feedback loop 56A configured to provide a feedback of the first ET voltage $V_{CCA}$ to the first voltage amplifier 48A.

The second voltage circuit 28B includes a second voltage amplifier 48B (denoted as "vAmpB") configured to generate a second initial ET voltage $V_{AMPB}$ based on a second ET target voltage $V_{TGTB}$ and a second supply voltage $V_{SUPB}$. In this regard, the second initial ET voltage $V_{AMPB}$ can correspond to a time-variant voltage envelope that tracks (e.g., rises and falls) a time-variant target envelope of the second ET target voltage $V_{TGTB}$. The second supply voltage $V_{SUPB}$ may be adjusted to cause the second voltage amplifier 48B to adjust amplitude of the second initial ET voltage $V_{AMPB}$ and thus adjust amplitude of the second ET voltage $V_{CCB}$.

The second voltage circuit 28B also includes a second offset capacitor 50B having a second capacitance $C_B$ (e.g., 10-100 nF) coupled between the second voltage amplifier 48B and the second node 30B. The second offset capacitor 50B is configured to raise the second initial ET voltage $V_{AMPB}$ by a second offset voltage $V_{OFFB}$ (e.g., 0.8 V) to generate the second ET voltage $V_{CCB}$ ($V_{CCB}=V_{AMPB}+V_{OFFB}$).

The second voltage circuit 28B also includes a second switch 52B (denoted as "SW") coupled between a second coupling node 54B and the GND. The second voltage circuit 28B further includes a second feedback loop 56B configured to provide a feedback of the second ET voltage $V_{CCB}$ to the second voltage amplifier 48B.

The ETIC 14 includes a supply voltage circuit 58 configured to generate the first supply voltage $V_{SUPA}$ and the second supply voltage $V_{SUPB}$. In a non-limiting example, the supply voltage circuit 58 can generate each of the first supply voltage $V_{SUPA}$ and the second supply voltage $V_{SUPB}$ at multiple levels to help maintain efficiency and linearity of the first voltage amplifier 48A and the second voltage amplifier 48B.

The ETIC 14 may include a first voltage equalizer circuit 60A (denoted as "VRF") and a second voltage equalizer circuit 60B (denoted as "VRF"). The first voltage equalizer circuit 60A is configured to generate the first ET target voltage $V_{TGTA}$ based on a common ET target voltage $V_{TGT}$. The second voltage equalizer circuit is configured to generate the second ET target voltage $V_{TGTB}$ based on the common ET target voltage $V_{TGT}$. The common ET target voltage $V_{TGT}$ is so generated to have a time-variant voltage envelope that tracks (rises and falls) a time-variant signal envelope of the RF signal 18.

In one embodiment, in the first power management mode, the control circuit 34 is configured to cause the first node 30A to output the first ET voltage $V_{CCA}$ and the low-frequency current $I_{DC}$. The control circuit 34 is also configured to cause the second node 30B to output the second ET voltage $V_{CCB}$ and an adjusted low-frequency current $I'_{DC}$ that is proportional to the low-frequency current $I_{DC}$. In this regard, the driver stage 20 is receiving the second ET voltage $V_{CCB}$ and the adjusted low-frequency current $I'_{DC}$, while the output stage 22 is receiving the first ET voltage $V_{CCA}$ and the low-frequency current $I_{DC}$.

Notably, the RF signal 18 has been amplified by the power amplifier 24 in the driver stage 20 when the RF signal 18 reaches the output stage 22. As such, the RF signal 18 will correspond to a higher amplitude at the output stage 22 than at the driver stage 20. As such, the first ET voltage $V_{CCA}$ needs to be greater than or equal to the second ET voltage $V_{CCB}$ ($V_{CCA} \geq V_{CCB}$) to prevent the RF signal 18 from being distorted at the output stage 22 (e.g., due to amplitude clipping).

More specifically, the control circuit 34 activates the first voltage amplifier 48A and the second voltage amplifier 48B to cause the first node 30A and the second node 30B to output the first ET voltage $V_{CCA}$ and the second ET voltage $V_{CCB}$, respectively. The control circuit 34 controls the LDO regulator in the multifunction circuit 32 to generate the adjusted low-frequency current $I'_{DC}$. The control circuit 34 also closes the switch in the multifunction circuit 32 to provide the adjusted low-frequency current $I'_{DC}$ to the second node 30B. The control circuit 34 further opens the first switch 52A and the second switch 52B to cause the first node 30A and the second node 30B to output the low-frequency current $I_{DC}$ and the adjusted low-frequency current $I'_{DC}$, respectively.

The control circuit 34 may determine a voltage differential across the first offset capacitor 50A (e.g., a difference between $V_{CCA}$ and $V_{AMPA}$). The voltage differential across the first offset capacitor 50A may serve as an indication of surplus or shortfall of the low-frequency current $I_{DC}$ at the first node 30A. Accordingly, the control circuit 34 generates the feedback signal 36 based on the voltage differential. Accordingly, the controller 46 in the PMIC 12 can control the MCP 42 based on the feedback signal 36 to cause the low-frequency voltage $V_{DC}$ and the low-frequency current $I_{DC}$ to decrease or increase.

The control circuit 34 may determine a voltage differential across the second offset capacitor 50B (e.g., a difference between $V_{CCB}$ and $V_{AMPB}$). The voltage differential across the second offset capacitor 50B may serve as an indication of surplus or shortfall of the adjusted low-frequency current $I'_{DC}$ at the second node 30B. Accordingly, the control circuit 34 may control the LDO regulator in the multifunction circuit 32 to decrease or increase the adjusted low-frequency current $I'_{DC}$.

Notably, when the RF signal 18 progresses trough the driver stage 20 and the output stage 22 of the multi-stage power amplifier circuit 16, the RF signal 18 can experience a temporal delay between the driver stage 20 and the output stage 22. As a result, the RF signal 18 can experience an instantaneous amplitude variation between the driver stage 20 and the output stage 22. In this regard, the first voltage equalizer circuit 60A and the second voltage equalizer circuit 60B can be configured to delay the first ET target voltage $V_{TGTA}$ from the second ET target voltage $V_{TGTB}$ by a determined temporal delay between the driver stage 20 and the output stage 22 of the multi-stage power amplifier circuit 16. As a result, the second ET voltage $V_{CCB}$ will be delayed from the first ET voltage $V_{CCA}$ by the determined temporal delay, thus helping to accommodate the temporal delay between the driver stage 20 and the output stage 22.

In another embodiment, in the second power management mode, the control circuit 34 is configured to cause the first node 30A and the second node 30B to each output the first ET voltage $V_{CCA}$ and the low-frequency current $I_{DC}$. Specifically, the control circuit 34 activates the first voltage amplifier 48A and deactivates the second voltage amplifier 48B to cause the first node 30A and the second node 30B to each output the first ET voltage $V_{CCA}$. The control circuit 34 also disables the LDO regulator and closes the switch in the multifunction circuit 32 to couple the second node 30B to the first node 30A to receive the low-frequency current $I_{DC}$. The control circuit 34 further opens the first switch 52A and the second switch 52B to cause the first node 30A and the second node 30B to each output the low-frequency current $I_{DC}$. The control circuit 34 is further configured to generate the feedback signal 36 based on the voltage differential across the first offset capacitor 50A.

In another embodiment, in the third power management mode, the control circuit 34 is configured to cause the first node 30A and the second node 30B to each output the second ET voltage $V_{CCB}$ and the low-frequency current $I_{DC}$. Specifically, the control circuit 34 deactivates the first voltage amplifier 48A and activates the second voltage amplifier 48B to cause the first node 30A and the second node 30B to each output the second ET voltage $V_{CCB}$. The control circuit 34 also disables the LDO regulator and closes the switch in the multifunction circuit 32 to couple the second node 30B to the first node 30A to receive the low-frequency current $I_{DC}$. The control circuit 34 further opens the first switch 52A and the second switch 52B to cause the first node 30A and the second node 30B to each output the low-frequency current $I_{DC}$. The control circuit 34 is further configured to generate the feedback signal 36 based on the voltage differential across the first offset capacitor 50A.

In another embodiment, in the fourth power management mode, the control circuit 34 is configured to cause the first node 30A and the second node 30B to each output the low-frequency voltage $V_{DC}$ and the low-frequency current $I_{DC}$. Specifically, the control circuit 34 deactivates the first voltage amplifier 48A and the second voltage amplifier 48B. As a result, none of the first ET voltage VCCA and the second ET voltage $V_{CCB}$ will be generated. The control circuit 34 also disables the LDO regulator and closes the switch in the multifunction circuit 32 to couple the second node 30B to the first node 30A to receive the low-frequency current $I_{DC}$. The control circuit 34 further closes the first switch 52A and opens the second switch 52B such that the low-frequency voltage $V_{DC}$ at the first node 30A and the second node 30B is modulated across the first offset capacitor 50A to track an average power of the RF signal 18. In this regard, the low-frequency voltage $V_{DC}$ can be referred to as an average power tracking (APT) voltage. The control circuit 34 is further configured to generate the feedback signal 36 based on the voltage differential across the first offset capacitor 50A and the PMIC 12 can modulate the low-frequency current $I_{DC}$ accordingly. As a result, both the driver stage 20 and the output stage 22 will operate based on the low-frequency voltage $V_{DC}$ and the low-frequency current $I_{DC}$.

In another embodiment, in the fifth power management mode, the control circuit 34 is configured to cause the first node 30A and the second node 30B to each output the low-frequency voltage $V_{DC}$ and the low-frequency current $I_{DC}$. Specifically, the control circuit 34 deactivates the first voltage amplifier 48A and the second voltage amplifier 48B. As a result, none of the first ET voltage $V_{CCA}$ and the second ET voltage $V_{CCB}$ will be generated. The control circuit 34 also disables the LDO regulator and closes the switch in the multifunction circuit 32 to couple the second node 30B to the first node 30A to receive the low-frequency current $I_{DC}$. The control circuit 34 further opens the first switch 52A and closes the second switch 52B such that the low-frequency voltage $V_{DC}$ at the first node 30A and the second node 30B is modulated across the second offset capacitor 50B to track the average power of the RF signal 18. In this regard, the low-frequency voltage $V_{DC}$ is also the APT voltage. The control circuit 34 is further configured to generate the feedback signal 36 based on the voltage differential across the first offset capacitor 50A and the PMIC 12 can modulate the low-frequency current $I_{DC}$ accordingly. As a result, both the driver stage 20 and the output stage 22 will operate based on the low-frequency voltage $V_{DC}$ and the low-frequency current $I_{DC}$.

Those skilled in the art will recognize improvements and modifications to the preferred embodiments of the present disclosure. All such improvements and modifications are considered within the scope of the concepts disclosed herein and the claims that follow.

What is claimed is:
1. A multi-mode power management apparatus comprising:
   a power management integrated circuit (PMIC) configured to generate a low-frequency current and a low-frequency voltage;

an envelope tracking (ET) integrated circuit (ETIC) comprising:
   a first node coupled to the PMIC;
   a second node coupled to the first node via a multi-function circuit;
   a first voltage circuit configured to generate a first ET voltage based on a first ET target voltage;
   a second voltage circuit configured to generate a second ET voltage based on a second ET target voltage; and
   a control circuit configured to:
      cause the first node and the second node to output one or more of the first ET voltage, the second ET voltage, and the low-frequency voltage; and
      cause the first node and the second node to output at least the low-frequency current; and
   a multi-stage power amplifier circuit coupled to the first node and the second node and configured to amplify a radio frequency (RF) signal, wherein the first ET target voltage is delayed from the second ET target voltage to accommodate for a temporal delay inside the multi-stage power amplifier circuit.

2. The multi-mode power management apparatus of claim 1 wherein, in a first power management mode, the control circuit is further configured to:
   cause the first node to output the first ET voltage and the low-frequency current; and
   cause the second node to output the second ET voltage less than or equal to the first ET voltage and an adjusted low-frequency current proportional to the low-frequency current.

3. The multi-mode power management apparatus of claim 1 wherein, in a third power management mode, the control circuit is further configured to cause the first node and the second node to each output the first ET voltage and the low-frequency current.

4. The multi-mode power management apparatus of claim 1 wherein, in a second power management mode, the control circuit is further configured to cause the first node and the second node to each output the second ET voltage and the low-frequency current.

5. The multi-mode power management apparatus of claim 1 wherein, in a fourth power management mode, the control circuit is further configured to cause the first node and the second node to each output the low-frequency voltage and the low-frequency current.

6. The multi-mode power management apparatus of claim 1, wherein the multi-stage power amplifier circuit comprises a driver stage coupled to the second node and an output stage coupled to the first node, the first ET target voltage is delayed from the second ET target voltage to thereby accommodate for the temporal delay between the driver stage and the output stage.

7. The multi-mode power management apparatus of claim 6 wherein the PMIC comprises:
   a multi-level charge pump (MCP) configured to generate the low-frequency voltage based on a battery voltage;
   a power inductor configured to induce the low-frequency current based on the low-frequency voltage; and
   a controller configured to adjust the low-frequency voltage and the low-frequency current based on a feedback signal.

8. The multi-mode power management apparatus of claim 7 wherein:
   the first voltage circuit comprises:
      a first voltage amplifier configured to generate a first initial ET voltage at a first coupling node based on the first ET target voltage;
      a first offset capacitor having a first capacitance and coupled between the first coupling node and the first node, the first offset capacitor configured to raise the first initial ET voltage by a first offset voltage to generate the first ET voltage; and
      a first switch coupled between the first coupling node and a ground;
   the second voltage circuit comprises:
      a second voltage amplifier configured to generate a second initial ET voltage at a second coupling node based on the second ET target voltage;
      a second offset capacitor having a second capacitance smaller than the first capacitance and coupled between the second coupling node and the second node, the second offset capacitor configured to raise the second initial ET voltage by a second offset voltage to generate the second ET voltage; and
      a second switch coupled between the second coupling node and the ground; and
   the control circuit is coupled to the first voltage amplifier, the second voltage amplifier, the multifunction circuit, the first switch, the second switch, and the controller.

9. The multi-mode power management apparatus of claim 8 wherein the ETIC further comprises:
   a supply voltage circuit configured to generate a multi-level supply voltage for one or more of the first voltage amplifier and the second voltage amplifier;
   a first voltage equalizer circuit configured to generate the first ET target voltage based on a common ET target voltage; and
   a second voltage equalizer circuit configured to generate the second ET target voltage based on the common ET target voltage.

10. The multi-mode power management apparatus of claim 8 wherein, in a first power management mode, the control circuit is further configured to:
   activate the first voltage amplifier and the second voltage amplifier to cause the first node and the second node to output the first ET voltage and the second ET voltage, respectively;
   control the multifunction circuit to generate an adjusted low-frequency current proportional to the low-frequency current; and
   open the first switch and the second switch to cause the first node and the second node to output the low-frequency current and the adjusted low-frequency current, respectively.

11. The multi-mode power management apparatus of claim 10 wherein the control circuit is further configured to:
   generate the feedback signal based on a voltage differential across the first offset capacitor; and
   control the multifunction circuit based on a voltage differential across the second offset capacitor.

12. The multi-mode power management apparatus of claim 10 wherein the first ET target voltage is delayed from the second ET target voltage based on a determined temporal delay between the driver stage and the output stage of the multi-stage power amplifier circuit.

13. The multi-mode power management apparatus of claim 8 wherein, in a second power management mode, the control circuit is further configured to:
   activate the first voltage amplifier and deactivate the second voltage amplifier to cause the first node and the second node to each output the first ET voltage;
   control the multifunction circuit to couple the second node to the first node to receive the low-frequency current; and open the first switch and the second switch to cause the first node and the second node to each output the low-frequency current.

14. The multi-mode power management apparatus of claim 13 wherein the control circuit is further configured to generate the feedback signal based on a voltage differential across the first offset capacitor.

15. The multi-mode power management apparatus of claim 8 wherein, in a second power management mode, the control circuit is further configured to:
  deactivate the first voltage amplifier and activate the second voltage amplifier to cause the first node and the second node to each output the second ET voltage;
  control the multifunction circuit to couple the second node to the first node to receive the low-frequency current; and
  open the first switch and the second switch to cause the first node and the second node to each output the low-frequency current.

16. The multi-mode power management apparatus of claim 15 wherein the control circuit is further configured to generate the feedback signal based on a voltage differential across the first offset capacitor.

17. The multi-mode power management apparatus of claim 8 wherein, in a second power management mode, the control circuit is further configured to:
  deactivate the first voltage amplifier and the second voltage amplifier;
  control the multifunction circuit to couple the second node to the first node to receive the low-frequency current; and
  close the first switch and open the second switch to cause the low-frequency voltage to be modulated across the first offset capacitor.

18. The multi-mode power management apparatus of claim 17 wherein the control circuit is further configured to generate the feedback signal based on a voltage differential across the first offset capacitor.

19. The multi-mode power management apparatus of claim 8 wherein, in a second power management mode, the control circuit is further configured to:
  deactivate the first voltage amplifier and the second voltage amplifier;
  control the multifunction circuit to couple the second node to the first node to receive the low-frequency current; and
  open the first switch and close the second switch to cause the low-frequency voltage to be modulated across the second offset capacitor.

20. The multi-mode power management apparatus of claim 19 wherein the control circuit is further configured to generate the feedback signal based on a voltage differential across the first offset capacitor.

* * * * *

UNITED STATES PATENT AND TRADEMARK OFFICE
CERTIFICATE OF CORRECTION

PATENT NO. : 12,231,098 B2
APPLICATION NO. : 17/629759
DATED : February 18, 2025
INVENTOR(S) : Nadim Khlat Page 1 of 1

It is certified that error appears in the above-identified patent and that said Letters Patent is hereby corrected as shown below:

In the Specification

In Column 6, Line 2, replace "ET voltage $v_{AMPB}$" with --ET voltage $V_{AMPB}$--.

Signed and Sealed this
Twenty-fifth Day of March, 2025

Coke Morgan Stewart
*Acting Director of the United States Patent and Trademark Office*